US010268409B2

(12) United States Patent
Lee et al.

(10) Patent No.: US 10,268,409 B2
(45) Date of Patent: Apr. 23, 2019

(54) MEMORY CONTROLLER MANAGING A TEMPERATURE OF A MEMORY DEVICE UPON A TRAINING OPERATION, A MEMORY SYSTEM, AND A METHOD OF OPERATING THE SAME

(71) Applicant: Samsung Electronics Co., Ltd., Suwon-si (KR)

(72) Inventors: Jong-min Lee, Gyeonggi-do (KR); Hyung-chan Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 292 days.

(21) Appl. No.: 15/210,556

(22) Filed: Jul. 14, 2016

(65) Prior Publication Data

US 2017/0083259 A1  Mar. 23, 2017

(30) Foreign Application Priority Data

Sep. 22, 2015 (KR) .......................... 10-2015-0133878

(51) Int. Cl.
 G06F 3/06 (2006.01)
 G11C 7/04 (2006.01)
 G11C 11/406 (2006.01)
(52) U.S. Cl.
 CPC ............ G06F 3/0634 (2013.01); G06F 3/061 (2013.01); G06F 3/0659 (2013.01); G06F 3/0673 (2013.01); G11C 7/04 (2013.01); G11C 11/40626 (2013.01); *G11C 2207/2254* (2013.01)

(58) Field of Classification Search
CPC combination set(s) only.
See application file for complete search history.

(56) References Cited

U.S. PATENT DOCUMENTS

| 6,667,925 B2 | 12/2003 | Kobayashi et al. |
| 7,647,467 B1 | 1/2010 | Hutsell et al. |
| 8,023,348 B2 | 9/2011 | Kohler et al. |
| 8,913,414 B2 | 12/2014 | Kim |
| 2007/0216376 A1* | 9/2007 | Ogawa .................. G01K 3/005 323/236 |

(Continued)

FOREIGN PATENT DOCUMENTS

| KR | 10-2001-0000792 | 1/2001 |
| KR | 10-1359366 | 2/2014 |

(Continued)

*Primary Examiner* — Ann J Lo
*Assistant Examiner* — Jane Wei
(74) *Attorney, Agent, or Firm* — Muir Patent Law, PLLC

(57) ABSTRACT

A method of operating a memory system, including a memory controller which controls at least one memory device included in the memory system, is disclosed. The method includes: comparing a temperature of at least one memory device included in the memory system with a reference temperature; conducting a heating operation on the at least one memory device in order to increase the temperature of the at least one memory device, based on the result of the comparing step; and controlling the operation on the at least one memory device until it is determined that the temperature of the at least one memory device is equal to or greater than the reference temperature.

17 Claims, 16 Drawing Sheets

(56) References Cited

U.S. PATENT DOCUMENTS

| | | | |
|---|---|---|---|
| 2012/0250433 A1* | 10/2012 | Jeon | G11C 8/18 365/193 |
| 2012/0284576 A1 | 11/2012 | Housty et al. | |
| 2013/0227268 A1 | 8/2013 | Ichida et al. | |
| 2014/0032826 A1 | 1/2014 | Lee et al. | |
| 2014/0189215 A1* | 7/2014 | Kang | G11C 11/40603 711/103 |
| 2015/0049536 A1* | 2/2015 | Oh | G11C 13/003 365/148 |
| 2015/0063010 A1 | 3/2015 | Kawa et al. | |
| 2015/0155054 A1 | 6/2015 | Lee et al. | |
| 2016/0224080 A1* | 8/2016 | Stewart | G06F 1/206 |
| 2016/0357217 A1* | 12/2016 | Ramsey | G06F 13/4291 |

FOREIGN PATENT DOCUMENTS

| | | |
|---|---|---|
| KR | 10-2014-0030220 | 3/2014 |
| KR | 10-2015-0024793 | 3/2015 |

\* cited by examiner

MEMORY CONTROLLER MANAGING A TEMPERATURE OF A MEMORY DEVICE UPON A TRAINING OPERATION, A MEMORY SYSTEM, AND A METHOD OF OPERATING THE SAME

CROSS-REFERENCE TO RELATED APPLICATION

This application claims priority under 35 USC § 119(a) to Korean Patent Application No. 10-2015-0133878, filed on Sep. 22, 2015, in the Korean Intellectual Property Office, the disclosure of which is incorporated herein in its entirety by reference.

BACKGROUND

The disclosure relates to a memory controller, a memory system, and a method of operating the same, and more particularly, to a memory controller managing a temperature of a memory device upon a training operation for the memory device, a memory system, and a method of operating the same.

Memory devices, which are widely used for high-performance electronic systems, have increasingly higher capacity and speed. As an example of the memory devices, a dynamic random access memory (DRAM), which is a volatile memory, is a memory determining data by a charge stored in a capacitor.

DRAMs have yield issues due to shrunk fabrication processes for accomplishing higher integration rates. For increasing a yielding rate, DRAMs are typically determined as passing or failing through wafer level testing or package level testing.

In various test processes, training is performed for determining optimal operating parameters of the DRAMs and operation margins are set using the optimal operating parameters in normal operation of the DRAMs. For example, during booting-up operation of a memory system, an idle state of the memory system, or the like, a training operation is conducted for optimizing set-up/hold time-related parameters of commands, data, and the like for a memory device. Here, as a result of conducting the training operation, the optimized parameters are applied upon conducting a normal operation of the memory system. Here, there may be a difference between a temperature of the memory device upon conducting the training operation and a temperature of the memory device upon conducting the normal operation. Along with higher speed and higher integration of a training memory system, set-up/hold time of commands, data, and the like absolutely decreases. Thus, since there occur distortion and shift of commands, data, and the like due to a temperature, the parameters optimized as a result of conducting the training operation may not be suitable for conducting the normal operation of the memory system.

SUMMARY

Some exemplary embodiments provide a memory system exhibiting improved performance through optimization of set-up/hold time of commands, data, and the like by conducting a training operation for a memory device in consideration of a temperature of the memory device conducting a normal operation after a training operation.

According to exemplary embodiments, a method of operating a memory system including a memory controller which controls at least one memory device is provided. The method includes: comparing a temperature of the at least one memory device with a reference temperature; conducting a heating operation on the at least one memory device in order to increase a temperature of the at least one memory device, based on a result of the comparing step; controlling the heating operation on the at least one memory device until it is determined that the temperature of the at least one memory device becomes equal to or greater than the reference temperature; and conducting a first training operation for the at least one memory device, after it is determined that the temperature of the at least one memory device is equal to or greater than the reference temperature.

In some embodiments, the method of operating the memory system further includes, after the first training operation has begun, stopping the first training operation when the temperature of the at least one memory device is less than the reference temperature.

In some embodiments, the method of operating the memory system further includes resuming the first training operation when the temperature of the memory device is equal to or greater than the reference temperature.

In some embodiments, the method of operating the memory system further includes: comparing the temperature of the at least one memory device with the reference temperature after the first training operation is completed and before conducting a second training operation for the at least one memory device; conducting the heating operation on the at least one memory device in order to increase the temperature of the at least one memory device, based on the comparison, before conducting the second training operation; and conducting the second training operation, wherein the second training operation is conducted when the temperature of the at least one memory device is equal to or greater than the reference temperature.

According to exemplary embodiments, the method of operating the memory system further includes setting, by the memory controller, the reference temperature based on an external temperature received from the outside of the memory system.

In some embodiments, the heating operation for increasing the temperature of the at least one memory device based on the comparison includes: providing a command to the at least one memory device when the temperature of the at least one memory device is less than the reference temperature; and conducting, by the at least one memory device, the heating operation of increasing the temperature of the at least one memory device in response to the stress-up command.

In some embodiments, the operation for increasing the temperature of the at least one memory device may be a stress-up operation which is an operation or various operations for increasing a temperature of a memory core included in the at least one memory device based on the result of comparing the temperature of the at least one memory device with the reference temperature.

In some embodiments, the operation for increasing the temperature of the at least one memory device may include: receiving a stress-up command from the memory controller; decoding the stress-up command into a refresh control signal; generating a refresh address for selecting a row, which is to be subjected to a refresh, from a memory cell array included in the memory core of the at least one memory device; and conducting a refresh operation on the selected row based on the refresh control signal.

In some embodiments, the method of operating the memory system further includes: providing, by the memory controller, a temperature request command requesting the temperature of the at least one memory device to the at least one memory device; and providing, by the at least one memory device, the temperature of the at least one memory device to the memory controller in response to the temperature request command.

In some embodiments, the refresh operation may include applying a refresh voltage to the memory cell array of the memory core to increase a temperature of the memory core.

According to some exemplary embodiments, the memory device may include a master chip and a slave chip electrically connected to the master chip is provided and the method includes: receiving a training operation command from the memory controller; comparing, by the slave chip, a temperature of the slave chip with a reference temperature in response to the training operation command; and conducting, by the slave chip, an operation for increasing the temperature of the slave chip based on the result of the comparing step.

In some embodiments, the method includes: controlling the operation on the slave chip until the temperature of the slave chip becomes equal to or greater than the reference temperature; and conducting a training operation for the master chip when the temperature of the slave chip is equal to or greater than the reference temperature.

In some embodiments, while the memory controller conducts a training operation for the master chip, the slave chip conducts a stress-up operation which is an operation or various operations for increasing a temperature of a memory core included in the slave chip based on the result of comparing the temperature of the slave chip with the reference temperature.

In some embodiments, the memory device is a stacked memory device, and the method of operating the memory system further includes: providing, by the memory controller, a training operation completion command to the stacked memory device; and terminating, by the slave chip, the comparing of the temperature of the slave chip with the reference temperature, and the operation for increasing the temperature of the slave chip that is based on the comparison, in response to the training operation completion command.

In some embodiments, a method of operating a memory is disclosed. The method includes: receiving a temperature of a memory device; receiving a first command to compare the temperature of the memory device to a reference temperature; comparing the temperature of the memory device to the reference temperature based on the first command; when it is determined that the temperature of the memory device is lower than the reference temperature, receiving a second command to increase the temperature of the memory device; and when it is determined that the temperature of the memory device is equal to or more than the reference temperature, transmitting a third command to perform a training operation for the memory device.

In some embodiments, a memory system includes at least one memory device; and a memory controller configured to control the at least one memory device. The memory controller is configured to: compare a temperature of the at least one memory device with a reference temperature; conduct an operation on the at least one memory device in order to increase a temperature of the at least one memory device; control the operation on the at least one memory device until the temperature of the at least one memory device becomes equal to or greater than the reference temperature; and conduct a first training operation for the at least one memory device when the temperature of the at least one memory device is equal to or greater than the reference temperature.

In some embodiments, the at least one memory device includes a master chip and a slave chip electrically connected to the master chip and the memory controller is configured to: control the operation on the slave chip until the temperature of the slave chip becomes equal to or greater than the reference temperature; and conduct the first training operation for the master chip when the temperature of the slave chip is equal to or greater than the reference temperature.

In some embodiments, the at least one memory device is configured to: receive a command from the memory controller to increase the temperature of the at least one memory device; decode the command into a refresh control signal; generate a refresh address for selecting a row, which is to be subjected to a refresh, from a memory cell array included in the memory core of the at least one memory device; and conduct a refresh operation on the selected row based on the refresh control signal.

In some embodiments, the refresh operation includes applying a refresh voltage to the memory cell array of the memory core to increase a temperature of the memory core.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
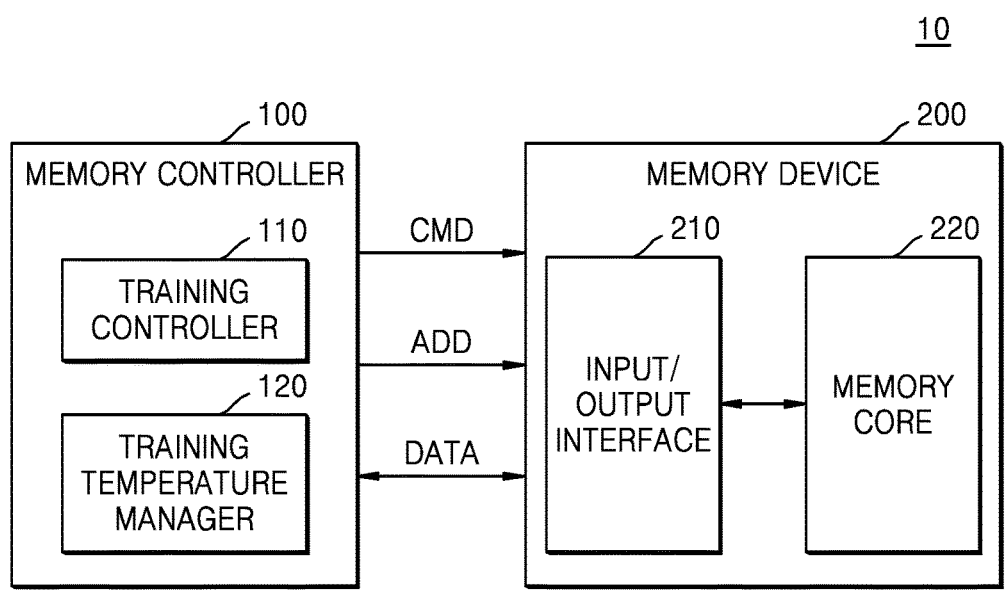
FIG. 1 is a block diagram of a memory system according to an exemplary embodiment of the inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

As used herein, expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a block diagram of a memory system according to an exemplary embodiment of the inventive concept. As shown in FIG. 1, a memory system 10 may include a memory controller 100 and a memory device 200. The memory controller 100 controls memory operations, such as writing/reading and the like, by providing various control signals to the memory device 200. For example, the memory controller 100 accesses data DATA of a cell array included in the memory core 220 by providing a command CMD and an address ADD to the memory device 200. The command CMD may include commands related to various memory operations such as data writing/reading and the like, and may include commands related to training operations conducted during boot-up of the memory system 10, an idle state of the memory system 10, and the like.

Figure 5:
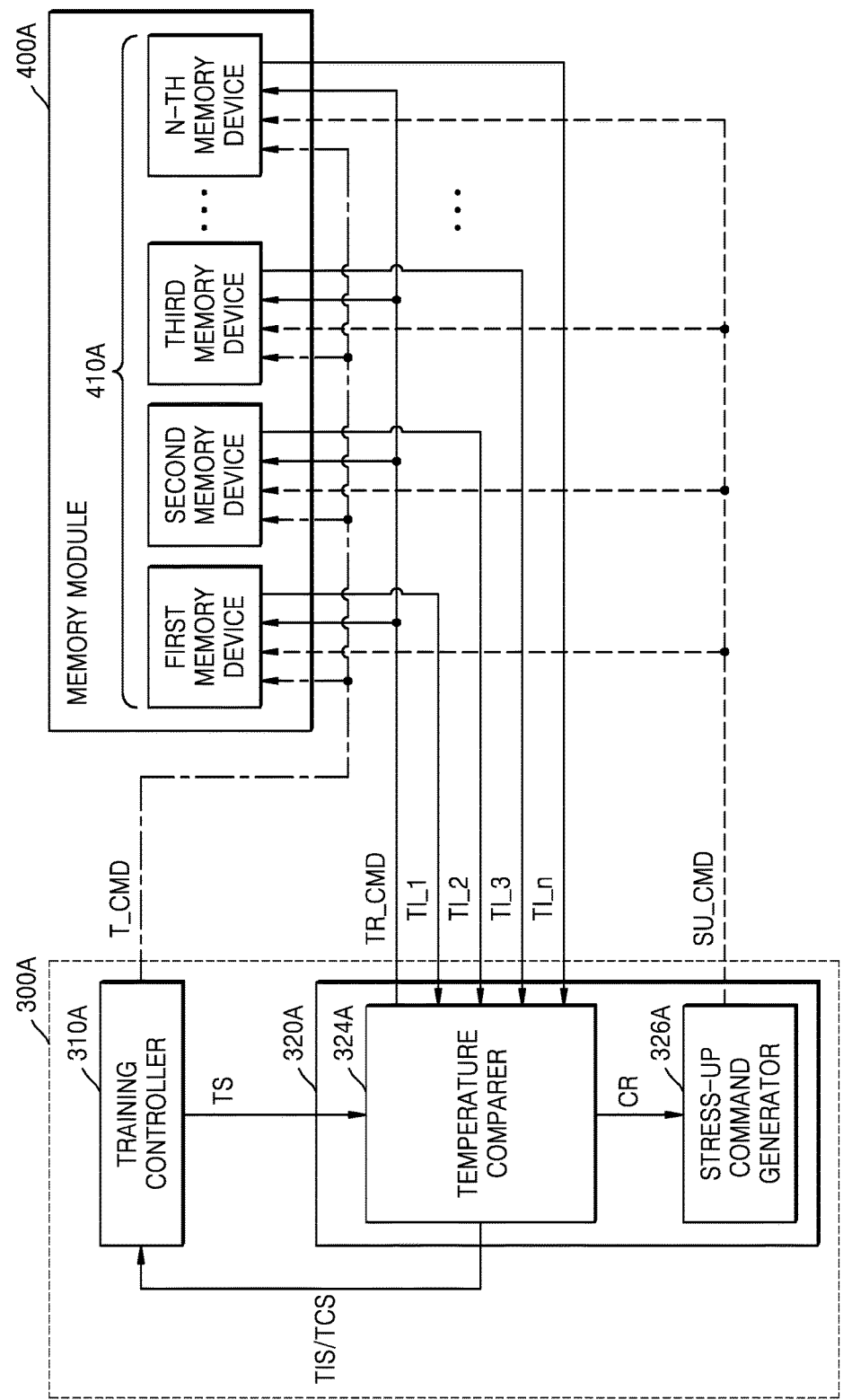
FIG. 5 is a block diagram of a memory system 20A according to another exemplary embodiment of the inventive concept.

In some embodiments, the memory device 200 may be a single memory chip or a memory module including a plurality of memory devices (e.g., as shown in FIG. 5).

In some exemplary embodiments, the memory device 200 and/or the memory controller 100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

In some embodiments, the memory system 10 of FIG. 1 may be employed in a computing system such as a mobile system or a desktop computer.

According to an exemplary embodiment, the memory device 200 may include an input/output interface 210 and a memory core 220.

In some embodiments, the input/output interface 210 may receive the address ADD, the data DATA, and the command CMD through input/output pads. The input/output interface 210 may include an address buffer buffering the address ADD, a data output buffer outputting the data DATA, a control logic decoding the command CMD, and the like. The memory core 220 may include memory cell arrays, a row decoder, and a column decoder. The memory core 220 may be switched from a normal operation mode to a training operation mode in response to a training operation command.

According to an exemplary embodiment, the memory controller 100 may include a training controller 110 and a training temperature manager 120. Each of the training controller 110 and training temperature manager 120 may be implemented using one or more circuits such as a training control circuit, or a temperature managing circuit. The training controller 110 may be managed by a memory scheduler (not shown) to control the memory device 200 to match operation characteristics of the memory device 200. The training controller 110 may control a training operation for the memory device 200 during booting-up operation, an idle state, or the like of the memory system 10. For example, during the training operation of the memory device 200, when a power is applied to the memory system 10 including the memory controller 110 and the memory device 200, a booting-up sequence is started. When the memory system 10 is in the booting-up sequence, I/O interface training is performed. In some embodiments, the I/O interface training may include at least one of address training, a clock training, a write training and a read training. After the I/O interface training is performed, memory core training is performed. After the memory core training is performed, normal operation of the memory device 200 is performed.

In some embodiments, for training the memory core 220, memory core parameters may be tested during the booting-up operation and trimmed memory core parameters may be determined based on the test results. The determined trimmed memory core parameters may be stored for applying the trimmed memory core parameters to the memory device 200 during the normal operation of the memory device 200.

In an exemplary embodiment, the memory core parameters may include direct current (DC) parameters and alternating current (AC) parameters. The DC parameters may include, for example, operating voltage VINTA of a memory cell array included in the memory core 220 or a bitline voltage VBL. The AC parameters may include, for example, a row address strobe to column address strobe delay time or a write recovery time. In addition, in certain embodiments, the memory core parameters may include various other parameters. Also, the memory core parameters may be updated to trimmed memory core parameters during each booting-up operation of the memory system 10.

In an exemplary embodiment, the training controller 110 may conduct a training operation for the input/output interface 210 of the memory device 200 and a training operation for the memory core 220. The training controller 110 may control various training operations, such as control/clock training for controlling phases, cycles, or the like of control signals and clock signals, read DQ/DQS training for controlling read data and phases, cycles, or the like of read data strobe signals, write DQ/DQS training for controlling write data and phases, cycles, or the like of write data strobe signals, and the like. According to this exemplary embodiment, the training controller 110 may further include a register, thereby storing optimized set-up/hold time-related parameters of the command CMD, the data DATA, and the like, which are determined as a result of conducting the training operation for the memory device 200, in the register.

In some embodiments, the training temperature manager 120 may manage a temperature of the memory device 200 when the training controller 110 controls the training operation for the memory device 200. For example, before conducting the training operation for the memory device 200, the training temperature manager 120 may receive a temperature of the memory device 200 from the memory device 200, and thereby compare the temperature of the memory device 200 with a reference temperature. The training temperature manager 120 may control conduct of a stress-up operation. According to exemplary embodiments, the stress-up operation may be an operation or various operations for increasing a temperature of the memory core 200. For example, the stress-up operation may be an operation of writing a predetermined pattern data stored in a mode register to the memory core 220, or a refresh operation for the memory device 200. In some embodiments, under the stress-up operation, additional thermal heat may be added to the memory device 200. For example, the memory device 200 may be subjected to near "boiling-point" or may be subjected to the influence of heat-stress in a controlled heater box (not shown), including adding voltage bouncing on a memory bus voltages of the memory device 200 and overclocking the memory bus by about 10% over its recommended speed.

According to an exemplary embodiment, the reference temperature may be set, based on the temperature of the memory device 200 when the memory device 200 conducts a normal operation such as read/write operations. For example, the reference temperature may correspond to an average value of a plurality of temperatures of the memory device 200, which is sensed when the memory device 200 conducts the normal operation, or correspond to the highest or lowest temperature among the plurality of the sensed temperatures of the memory device 200. For example, the highest temperature may be about 85° C. and the lowest temperature may be about 0° C.

According to an exemplary embodiment, the training temperature manager 120 may include a register, and thereby store the reference temperature.

According to an exemplary embodiment, when the temperature of the memory device 200 is less than the reference temperature, the training temperature manager 120 may control the training controller 110 to stop the conduct of the training operation for the memory device 200. In addition, the training temperature manager 120 may control the conduct of the stress-up operation for the memory device 200 until the temperature of the memory device 200 becomes equal to or greater than the reference temperature. Through the conduct of the stress-up operation, when the temperature of the memory device 200 is equal to or greater than the reference temperature, the training temperature manager 120 may stop the comparing of the temperature of the memory device 200 with the reference temperature and the stress-up operation, and may control the training controller 110 to resume the conduct of the training operation for the memory device 200.

As described above, according to exemplary embodiments, the training controller 110 may control conduct of a plurality of various training operations. Thus, whenever the training controller 110 controls conduct of a new training operation, the training temperature manager 120 may compare the temperature of the memory device 200 with the reference temperature, and may control the conduct of the stress-up operation for the memory device 200 based on the comparison. For example, the training controller 110 may conduct a first training operation and a second training operation, and before the first training operation is started, the training temperature manager 120 may compare the temperature of the memory device 200 with the reference temperature, and may control the conduct of the stress-up operation for the memory device 200 based on the comparison. As a result of conducting the stress-up operation, when the temperature of the memory device 200 is equal to or greater than the reference temperature, the training temperature manager 120 may control the training controller 110 to resume the conduct of the first training operation. After the conduct of the first training operation is completed, before the conduct of the second training operation is started, the training temperature manager 120 may compare the temperature of the memory device 200 with the reference temperature, and may control the conduct of the stress-up operation for the memory device 200 based on the comparison. For example, after the conduct of the first training operation is completed and before the conduct of the second training operation is started, if the temperature of the memory device 200 is measured to be lower than the reference temperature, the training temperature manager 120 controls the conduct of the stress-up operation to increase the temperature of the memory device 200. As a result of conducting the stress-up operation, when the temperature of the memory device 200 is equal to or greater than the reference temperature, the training temperature manager 120 may control the training controller 110 to resume the conduct of the second training operation.

A configuration in which the memory controller 100 includes the training controller 110 and the training temperature manager 120 is merely an exemplary embodiment, and the inventive concept is not limited thereto. In an exemplary embodiment, the memory device 200 may include the training controller 110 and the training temperature manager 120, which include a built-in self test (BIST) circuit, and the training controller 110 and the training temperature manager 120 may respectively conduct the same operations as the operations described above. In this exemplary embodiment, the BIST circuit and the memory core 220 are connected to each other via a multiplexer (not shown).

According to the following embodiments, descriptions will be made referring to the memory controller 100 which includes the training controller 110 and the training temperature manager 120.

According to exemplary embodiments, prior to conducting the training operation for the memory device 200, the temperature of the memory device 200 is increased by conducting the stress-up operation of the memory device 200, thereby allowing the temperature of the memory device 200 upon conducting the training operation to become the same as or similar to the temperature of the memory device 200 upon conducting the normal operation. Thus, the memory device 200 may conduct an optimized normal operation, based on parameters determined as a result of conducting the training operation. As such, the training operation is conducted in consideration of the temperature of the memory device 200 upon the normal operation, thereby improving performance of the memory system.

Figure 2A:
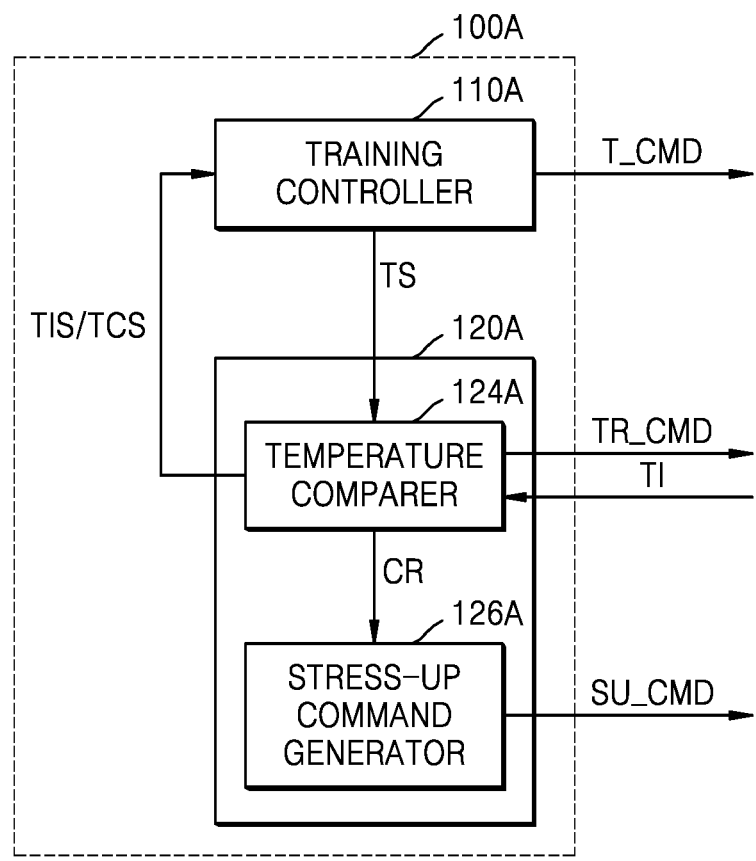
FIGS. 2A and 2B are block diagrams of exemplary embodiments of the memory controller shown in FIG. 1.
Figure 2B:
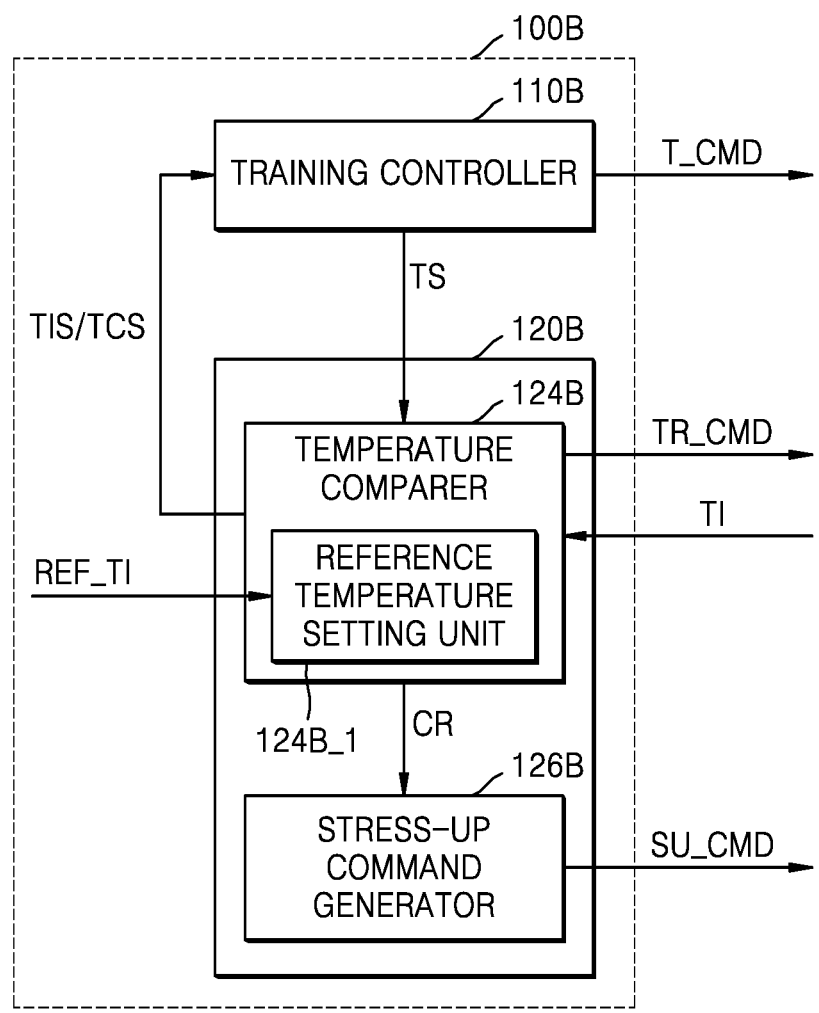

FIGS. 2A and 2B are block diagrams of exemplary embodiments of the memory controller shown in FIG. 1. As shown in FIG. 2A, a memory controller 100A may include a training controller 110A and a training temperature manager 120A. The memory controller 100 may further include various other functional blocks that include circuitry for controlling the memory device 200, although the other functional blocks are not shown in FIG. 2. In addition, the functional blocks of the memory controller 100A, and signal transmission and reception relations therebetween are shown as merely an example in FIG. 2, and even though the various functional blocks, and the signal transmission and reception relations therebetween are modified, various functions according to exemplary embodiments of the inventive concept can be conducted.

Referring to FIGS. 1 and 2A, in an exemplary embodiment, the training temperature manager 120A may include a temperature comparer 124A (e.g., a temperature comparing circuit) and a stress-up command generator 126A (e.g., a stress-up command generating circuit). The temperature comparer 124A may compare the temperature of the memory device 200 with the reference temperature, and may determine whether the training operation and the stress-up operation are conducted based on the comparison. The stress-up command generator 126A may generate a stress-up command for controlling the stress-up operation of the memory device 200 when the temperature comparer 124A determines that the stress-up operation is conducted. However, the training temperature manager 120A is not limited to a configuration shown in FIG. 2A, and the stress-up command generator 126A may be included in a command generator of the memory controller 110A. Hereinafter, specific operations of the memory controller 100A will be described.

According to an exemplary embodiment, prior to starting the training operation for the memory device 200, the training controller 110A may provide a training start signal TS informing a start of a training operation to the temperature comparer 124A. The temperature comparer 124A may provide a temperature request command TR_CMD requesting temperature TI of the memory device 200 to the memory device 200 in response to the training start signal TS. The temperature comparer 124A may receive the temperature TI of the memory device 200 from the memory device 200, and may compare the temperature TI of the memory device 200 with the reference temperature. In an exemplary embodiment, when the temperature TI of the memory device 200 is less than the reference temperature, the temperature comparer 124A provides a training interrupt signal TIS to the training controller 110A in order to stop the conduct of the training operation, and the training controller 110A may stop the conduct of the training operation in response to the training interrupt signal TIS. In addition, to conduct the stress-up operation of the memory device 200, the temperature comparer 124A may provide a comparison result signal CR to the stress-up command generator 126A. The stress-up command generator 126A may provide a stress-up command SU_CMD for controlling the stress-up operation of the memory device 200 to the memory device 200, based on the comparison result signal CR.

According to exemplary embodiments, the temperature comparer 124A may provide the temperature request command TR_CMD requesting the temperature TI of the memory device 200 to the memory device 200 after the stress-up operation of the memory device 200 is conducted. However, the inventive concept is not limited thereto, and the memory device 200 may cyclically provide the temperature TI of the memory device 200 to the temperature comparer 124A. Next, the temperature comparer 124A may receive the temperature TI of the memory device 200, and thereby compare the temperature TI of the memory device 200 with the reference temperature. When the temperature TI of the memory device 200 is equal to or greater than the reference temperature, the temperature comparer 124A may provide a training resumption signal TCS to the memory controller 110A in order to resume the conduct of the training operation, and the training controller 110A may provide a training command T_CMD to the memory device 200 in response to the training resumption signal TCS, and resume the conduct of the training operation. In addition, in order not to conduct the stress-up operation of the memory device 200, the comparison result signal CR may be provided to the stress-up command generator 126A. The stress-up command generator 126A may not generate the stress-up command SU_CMD, based on the comparison result signal CR. Next, before conduct of a new training operation is started, the memory controller 100A may conduct the operations described above again.

In a configuration shown in FIG. 2B, a temperature comparer 124B may further include a reference temperature setting unit 124B_1 as compared with the configuration shown in FIG. 2A, and the other components are the same as in FIG. 2A. The reference temperature setting unit 124B_1 may receive reference information REF_TI, and thereby set the reference temperature based on the reference information REF_TI. For example, the reference information REF_TI may include at least one of a temperature of the memory device 200 upon conducting a normal operation and an external temperature indicating a temperature of an environment external to the memory system 10. In an exemplary embodiment, if the temperature of the environment external to the memory system 10 is high (e.g., about 150° C.), the reference temperature setting unit 124B_1 may set a high reference temperature. If the temperature of the environment external to the memory system is low (e.g., about −40° C.), the reference temperature setting unit 124B_1 may set a low reference temperature. Thus, the training operation is conducted to match the environment external to the memory system, thereby determining optimized parameters.

Figure 3:
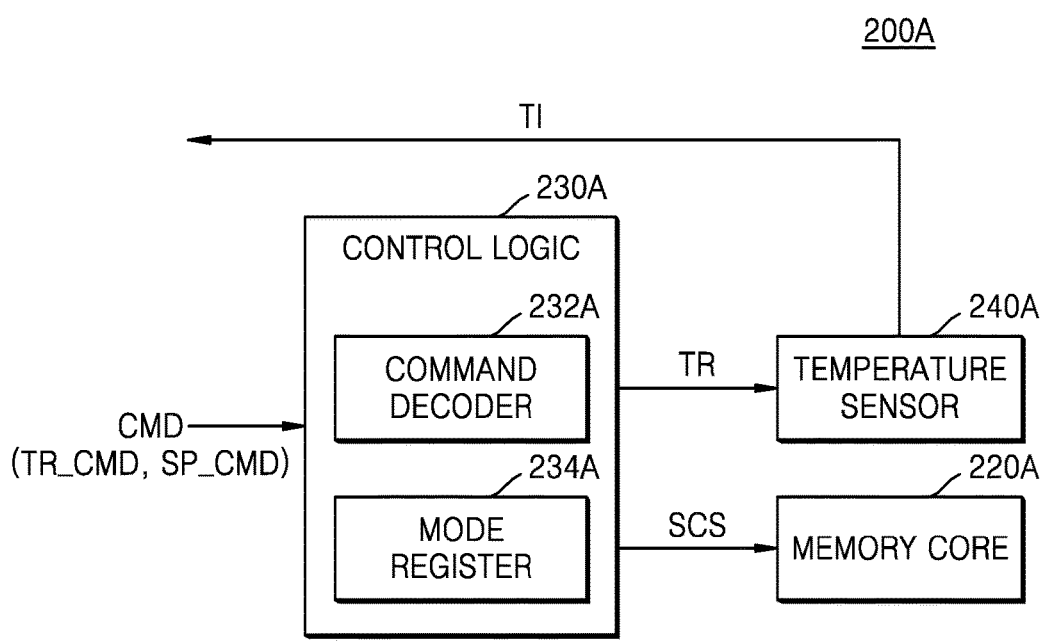
FIG. 3 is a block diagram of an exemplary embodiment of a memory device shown in FIG. 1.

FIG. 3 is a block diagram of an exemplary embodiment of the memory device shown in FIG. 1. A memory device 200A shown in FIG. 3 is merely an exemplary embodiment, and a configuration of the memory device according to the inventive concept can be variously modified. The memory device 200A may include one or more memory chips, and the memory device 200A of FIG. 3 may show a configuration of any one of the memory chips. The memory device 200A may include a memory core 220A, a control logic 230A, and a temperature sensor 240A. The control logic 230A may be realized inside the input/output interface 210 of FIG. 1.

According to an exemplary embodiment, the memory device 200A may be a dynamic random access memory (DRAM) such as a double data rate synchronous dynamic random access memory (DDR SDRAM), a low power double data rate (LPDDR) SDRAM, a graphics double data rate (GDDR) SDRAM, a rambus dynamic random access memory (RDRAM), or the like. According to an alternative exemplary embodiment, the memory device 200A may be another type of memory device requiring conduct of a training operation. For example, if a resistive memory device conducts a refresh operation as a non-volatile memory, the memory device 200A according to an exemplary embodiment of the inventive concept may be a non-volatile memory.

The control logic 230A may control overall operations of the memory device 200A. For example, the control logic 230A may include a command decoder 232A and a mode register 234A. The control logic 230A may generate control signals to conduct a training operation, a write operation, a read operation, or the like according to the command CMD of the memory controller.

In an exemplary embodiment, the control logic 230A may generate control signals for requesting a temperature of the memory device 200A according to the temperature request command TR_CMD and control signals for stress-up operations according to the stress-up command SU_CMD from the memory controller. The mode register 234A may include a large number of registers storing information for setting an operation environment of the memory device 200A, and when receiving a specific command from the memory controller, the control logic 230A may generate control signals corresponding thereto based on the mode register 234A.

The temperature sensor 240A may sense and output the temperature of the memory device 200A according to a predetermined cycle. In an exemplary embodiment, the temperature sensor 240A may sense and output the temperature of the memory device 200A in real time. The temperature sensor 240A may include a register storing the sensed temperature of the memory device 200A. Hereinafter, specific exemplary operations of the memory device 200A will be described.

According to an exemplary embodiment, the control logic 230A may receive the temperature request command TR_CMD from the memory controller, and may provide a temperature request signal TR to the temperature sensor 240A by decoding the temperature request command TR_CMD into the temperature request signal TR. The temperature sensor 240A may provide the temperature TI of the memory device to the memory controller in response to the temperature request signal TR. In an exemplary embodiment, the control logic 230A may receive the stress-up command SU_CMD from the memory controller, and may provide a stress-up control signal SCS to the memory core 220A by decoding the stress-up command SU_CMD into the stress-up control signal SCS. The memory core 220A may conduct a stress-up operation in response to the stress-up control signal SCS. The stress-up operation is an operation for increasing a temperature of the memory core 220A, and various operations of increasing the temperature of the memory core 220A may correspond to the stress-up operation. For example, the stress-up operation may be an operation of writing a predetermined pattern data stored in the mode register 234A to the memory core 220A, or a refresh operation for the memory device 200A. After the stress-up operation is conducted, the temperature sensor 240A may update the temperature TI of the memory device 200A by sensing the temperature of the memory device 200A, and when receiving the temperature request signal TR, the temperature sensor 240A may provide the temperature TI of the memory device 200A to the memory controller.

Figure 4:
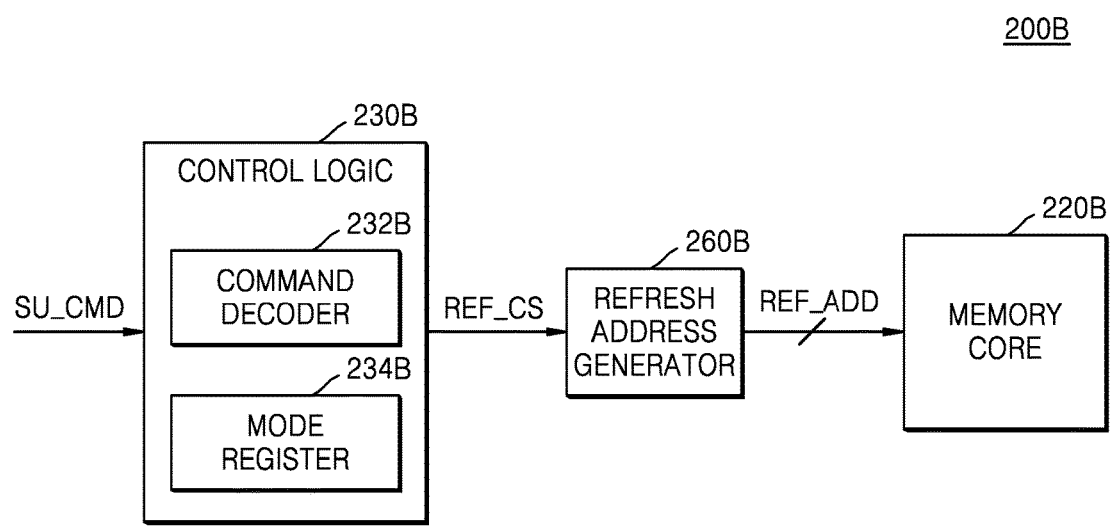
FIG. 4 is a diagram of an exemplary embodiment of a memory device for explaining a process of conducting a stress-up operation.

FIG. 4 is a diagram of an exemplary embodiment of a memory device for explaining a process of conducting a stress-up operation. As shown in FIG. 4, a memory device 200B may include a control logic 230B, a refresh address generator 260B, and a memory core 220B. When receiving a stress-up command SU_CMD from a memory controller, the control logic 230B may decode the stress-up command SU_CMD into a refresh control signal REF_CS for controlling a refresh operation of the memory device 200B, based on a mode register 234B. The refresh address generator 260B may generate a refresh address REF_ADD for selecting a row, which is to be subjected to a refresh, from a memory cell array of the memory core 220B, in response to the refresh control signal REF_CS. For example, the refresh address generator 260B may include a counter (not shown) therein, and may sequentially generate the refresh address REF_ADD having an increasing value according to a counting operation of the counter.

In an exemplary embodiment, the refresh operation for the memory cell array of the memory core 220B may be conducted, based on the refresh control signal REF_CS and the refresh address REF_ADD. For example, the stress-up operation may be the refresh operation, and the refresh operation of applying a refresh voltage to the memory cell array of the memory core 220B may be conducted, thereby increasing a temperature of the memory core 220B. The stress-up operation may be referred to generally as a heating operation in the various embodiments described herein. Also, a stress-up operation or heating operation may refer to a particular set of steps performed but does not necessarily refer to a specific instance of an operation performed. For example, certain claims may refer to a stress-up operation or a heating operation, and then later refer to "the stress-up" operation or "the heating operation." The use of the term "the" in these instances may not necessarily refer to the same instance of the operation, but may refer to another instance of performing the same set of steps that constitute the operation.

FIG. 5 is a block diagram of a memory system 20A according to another exemplary embodiment of the inventive concept. As shown in FIG. 5, the memory system 20A may include a memory controller 300A and a memory module 400A. The memory module 400A may include a plurality of memory devices 410A. Since each of the memory devices 410A corresponds to the memory devices described with reference to FIGS. 1, 3, and 4, and the memory controller 300A corresponds to the memory controllers described with reference to FIGS. 1 and 2A, details thereof will be omitted. The specific operations of the memory system 20A will be described below.

Referring to FIG. 5, a training controller 310A may simultaneously control conduct of a training operation for the plurality of memory devices 410A. For example, the memory module may be a double in-line memory module (DIMM), and the plurality of memory devices 410A may be a rank unit. The training controller 310A may conduct the training operation in units of a rank. However, the inventive concept is not limited thereto, and the training operation may be simultaneously conducted for ranks sharing a command/address bus.

Before the training operation for the plurality of memory devices 410A is conducted, the training controller 310A may provide a training start signal TS informing a start of the training operation to a temperature comparer 324A. The temperature comparer 324A may provide a temperature request command TR_CMD requesting temperatures TI_1 to TI_n (where n is an integer) of the memory devices to each of the memory devices 410A in response to the training start signal TS. The temperature comparer 324A may receive the temperatures TI_1 to TI_n of the memory devices from the respective memory devices 410A, and may compare the temperatures TI_1 to TI_n of the memory devices with a reference temperature. In an exemplary embodiment, the temperature comparer 324A may calculate an average temperature of the temperatures TI_1 to TI_n of the memory devices, and may compare the average temperature of the memory devices with the reference temperature. For example, when n=3, and the temperature comparer 324A receives three (3) temperature values, e.g., TI_1=40° C., TI_2=50° C., TI_3=60° C. (these temperature values are merely exemplary and not limited thereto) from the first, second, and third memory devices, respectively, the temperature comparer 324A may calculate an average temperature of 50° C. of the temperatures TI_1 to TI_3 of the first, second, and third memory devices and may compare the average temperature of 50° C. of the first, second, and third memory devices with the reference temperature. In another exemplary embodiment, the temperature comparer 324A may select the lowest temperature of the memory device from among the temperatures TI_1 to TI_n of the memory devices, and may compare the lowest selected temperature of the memory device with the reference temperature. According to an exemplary embodiment, the lowest selected temperature of the memory device is assumed to be a temperature TI_1 of a first memory device and that the temperature TI_1 of the first memory device is compared with the reference temperature. For example, when n=4, and the temperature comparer 324A receives four (4) temperature values, e.g., TI_1=30° C., TI_2=40° C., TI_3=50° C., and TI_4=60° C. (these temperature values are merely exemplary and not limited thereto) from the first, second, third, and fourth memory devices, respectively, the temperature comparer 324A may select the lowest temperature of TI_1=30° C. of the first memory device to compare with the reference temperature.

In an exemplary embodiment, when the temperature TI_1 of the first memory device is less than the reference temperature, a training interrupt signal TIS may be provided to the training controller 310A in order to stop the conduct of the training operation, and the training controller 310A may stop the conduct of the training operation in response to the training interrupt signal TIS. In an exemplary embodiment, to conduct stress-up operations of the plurality of memory devices 410A, a comparison result signal CR may be provided to a stress-up command generator 326A. The stress-up command generator 326A may provide a stress-up command SU_CMD for controlling the stress-up operations of the plurality of memory devices 410A to each of the memory devices 410A, based on the comparison result signal CR.

After the stress-up operations of the plurality of memory devices 410A are conducted, the temperature comparer 324A may provide the temperature request command TR_CMD requesting the temperatures TI_1 to TI_n of the memory devices to each of the memory devices 410A. Next, the temperature comparer 324A may select the lowest temperature of the memory device from among the temperatures TI_1 to TI_n of the memory devices by receiving the temperatures TI_1 to TI_n of the memory devices, and may compare the lowest temperature of the memory device with the reference temperature. However, this is merely an exemplary embodiment, and there can be various exemplary embodiments, such as an exemplary embodiment in which the temperature comparer 324A provides the temperature request command TR_CMD requesting the temperatures of the memory devices only to the first memory device that has provided the lowest temperature, and then compares the received temperature of the first memory device with the reference temperature.

According to an exemplary embodiment, the lowest temperature of the memory device is assumed to be a temperature TI_2 of a second memory device. When the temperature TI_2 of the second memory device is equal to or greater than the reference temperature, the temperature comparer 324A may provide a training resumption signal TCS to the training controller 310A in order to resume the conduct of the training operation, and the training controller 310A may provide a training command T_CMD to the plurality of memory devices 410A in response to the training resumption signal TCS, thereby resuming the conduct of the training operation. In an exemplary embodiment, in order not to conduct the stress-up operations of the plurality of memory devices 410A, the comparison result signal CR may be provided to the stress-up command generator 326A. The stress-up command generator 326A may not generate the stress-up command SU_CMD, based on the comparison result signal CR. In an exemplary embodiment, before a new training operation is conducted, the memory controller 300A may repeat the operations of the training controller 310A, the temperature comparer 324A, and the stress-up command generator 326A as described above.

Figure 6:
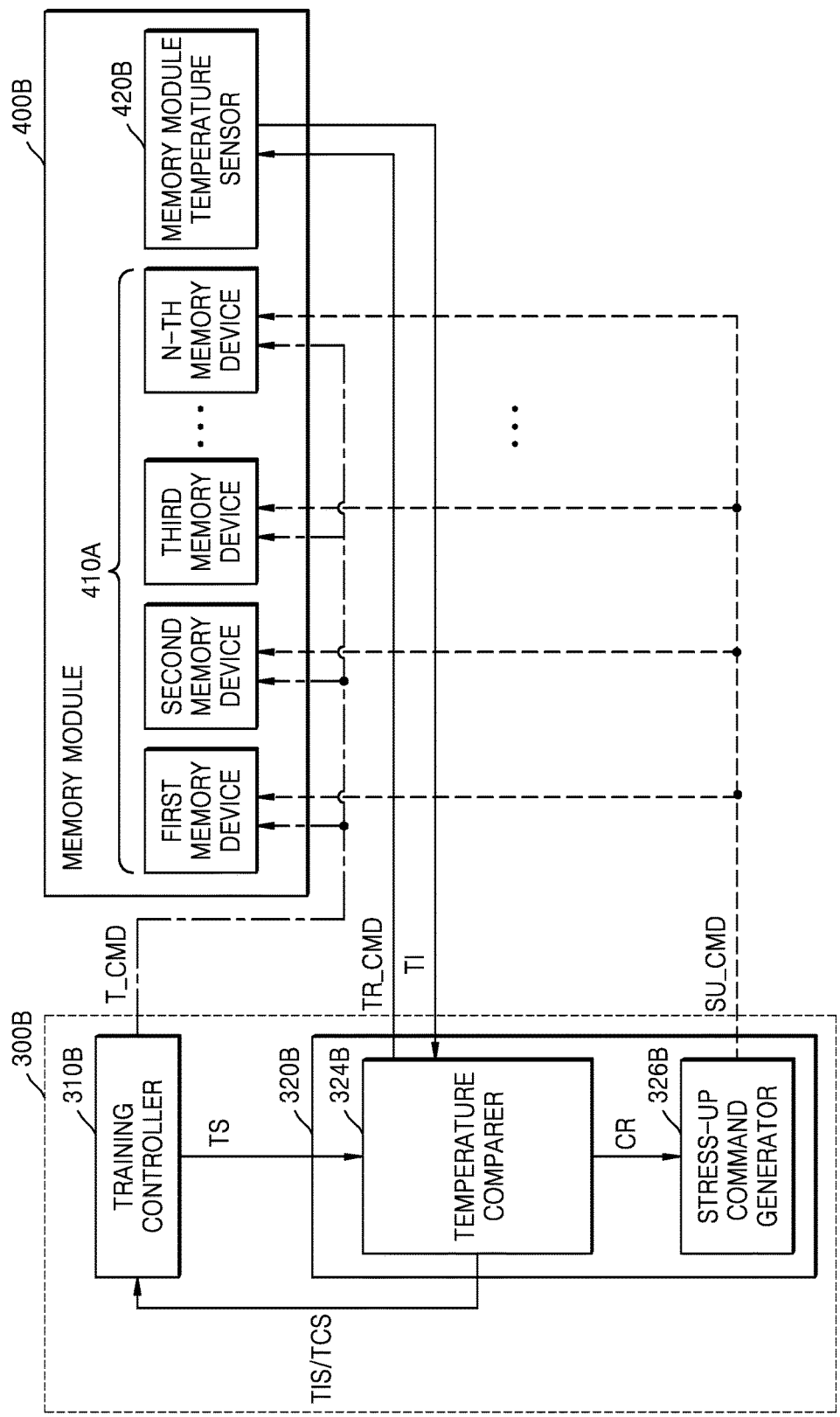
FIG. 6 is a block diagram of a memory system 20B according to a further exemplary embodiment of the inventive concept.

FIG. 6 is a block diagram of a memory system 20B according to a further exemplary embodiment of the inventive concept. As shown in FIG. 6, a memory module 400B further includes a memory module temperature sensor 420B, and the other components correspond to the components disclosed in FIG. 5. The memory module temperature sensor 420B may sense and output a temperature of the memory module 400B according to a predetermined cycle. In an exemplary embodiment, the memory module temperature sensor 420B may sense and output the temperature of the memory module 400B in real time. The memory module temperature sensor 420B may include a register storing the sensed temperature of the memory module.

Unlike the temperature comparer 324A disclosed in FIG. 5, a temperature comparer 324B may provide a temperature request command TR_CMD to the memory module temperature sensor 420B, and the memory module temperature sensor 420B may provide the temperature TI of the memory module to the temperature comparer 324B in response to the temperature request command TR_CMD. Since operations other than this have been described with reference to FIG. 5, details thereof will be omitted.

Figure 7:
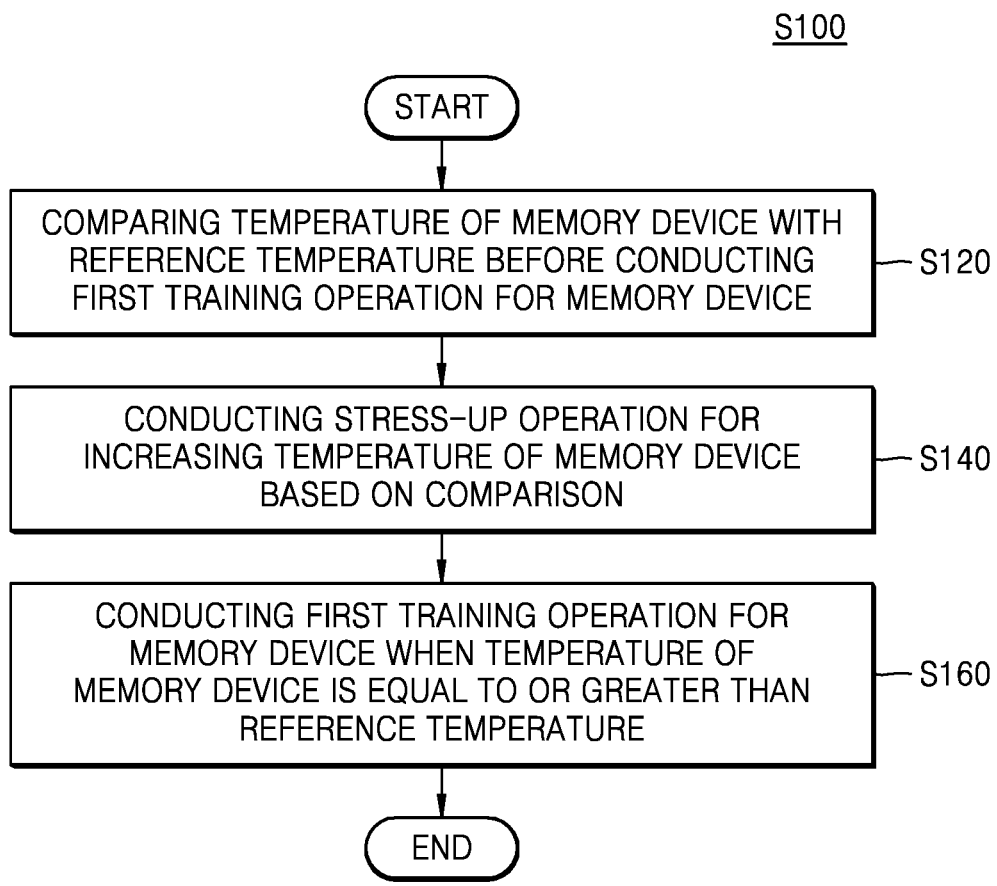
FIG. 7 is a flow chart showing a method of operating a memory system according to an exemplary embodiment of the inventive concept.

FIG. 7 is a flow chart showing a method of operating a memory system according to an exemplary embodiment of the inventive concept.

As shown in FIGS. 1 and 7, according to this exemplary embodiment, before the first training operation of the memory device 200 is conducted, the training temperature manager 120 may compare the temperature of the memory device with the reference temperature (S120). The training temperature manager 120 may conduct the stress-up operation for increasing the temperature of the memory device 200 based on the comparison (S140). The training temperature manager 120 may control the stress-up operation to be conducted until the temperature of the memory device 200 becomes equal to or greater than the reference temperature. When the temperature of the memory device 200 becomes equal to or greater than the reference temperature through the stress-up operation, the training temperature manager 120 controls the training controller 110 to conduct the first training operation (S160).

Figure 8:
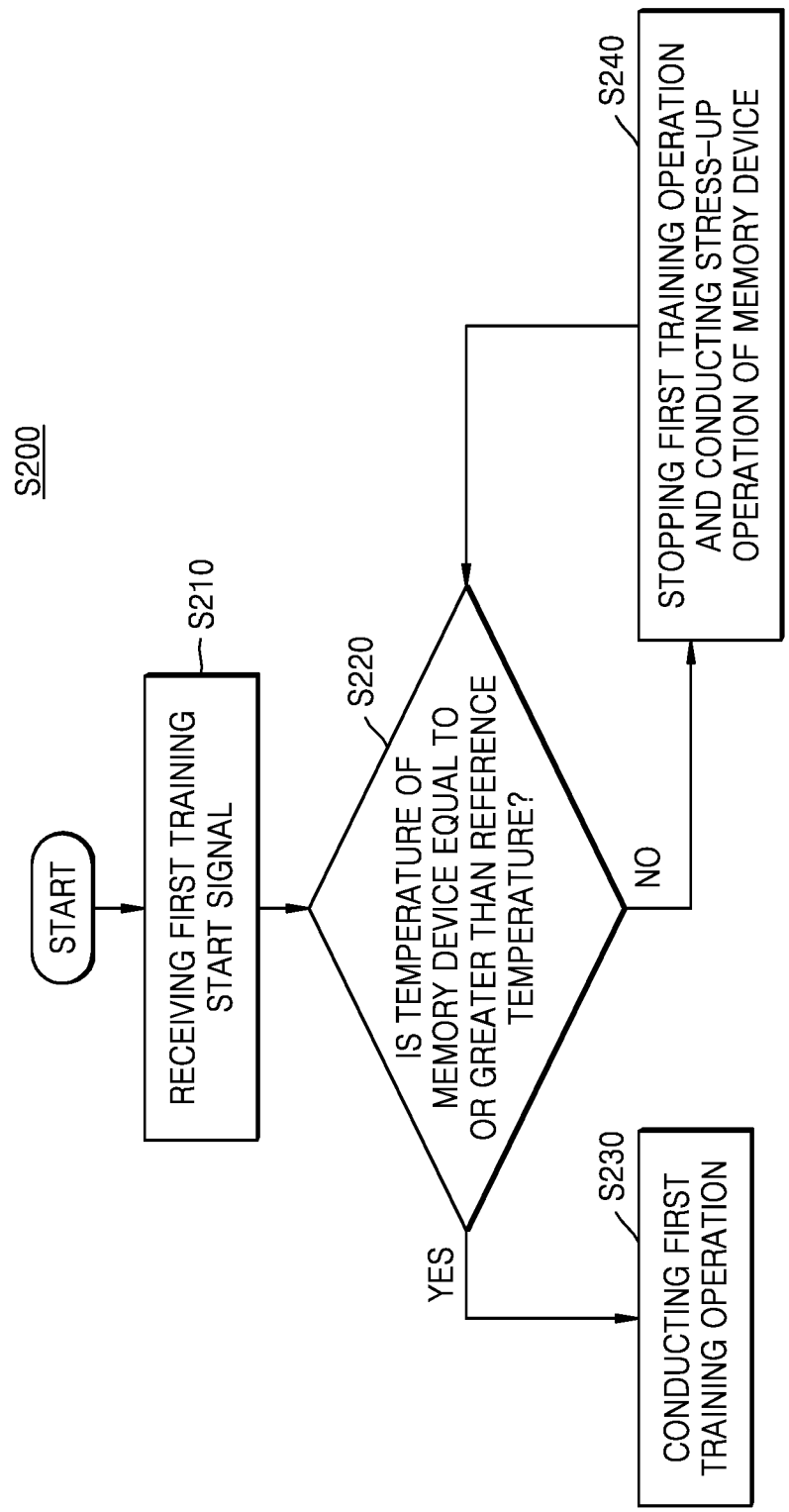
FIG. 8 is a flow chart showing a method of operating a memory system according to another exemplary embodiment of the inventive concept.

FIG. 8 is a flow chart showing a method of operating a memory system according to another exemplary embodiment of the inventive concept.

As shown in FIGS. 1 and 8, according to this exemplary embodiment, the training temperature manager 120 may receive a first training start signal TS from the training controller 110 (S210). The training temperature manager 120 may determine whether the temperature of the memory device 200 is equal to or greater than the reference temperature in response to the first training start signal TS (S220). When the temperature of the memory device 200 is equal to or greater than the reference temperature (Yes), the training temperature manager 120 may control the training controller 110 to conduct the first training operation (S230). When the temperature of the memory device 200 is less than the reference temperature (No), the training temperature manager 120 may stop the first training operation by providing the training interrupt signal to the training controller 110, and may conduct the stress-up operation for increasing the temperature of the memory device 200 (S240). The stress-up operation may be repeated according to a predetermined cycle until the temperature of the memory device 200 becomes equal to or greater than the reference temperature. After the stress-up operation, the training temperature manager 120 may compare the temperature of the memory device 200 with the reference temperature again (S220), and when the temperature of the memory device 200 is equal to or greater than the reference temperature (Yes), the training temperature manager 120 may provide the training resumption signal TCS to the training controller to resume the first training operation.

Figure 9:
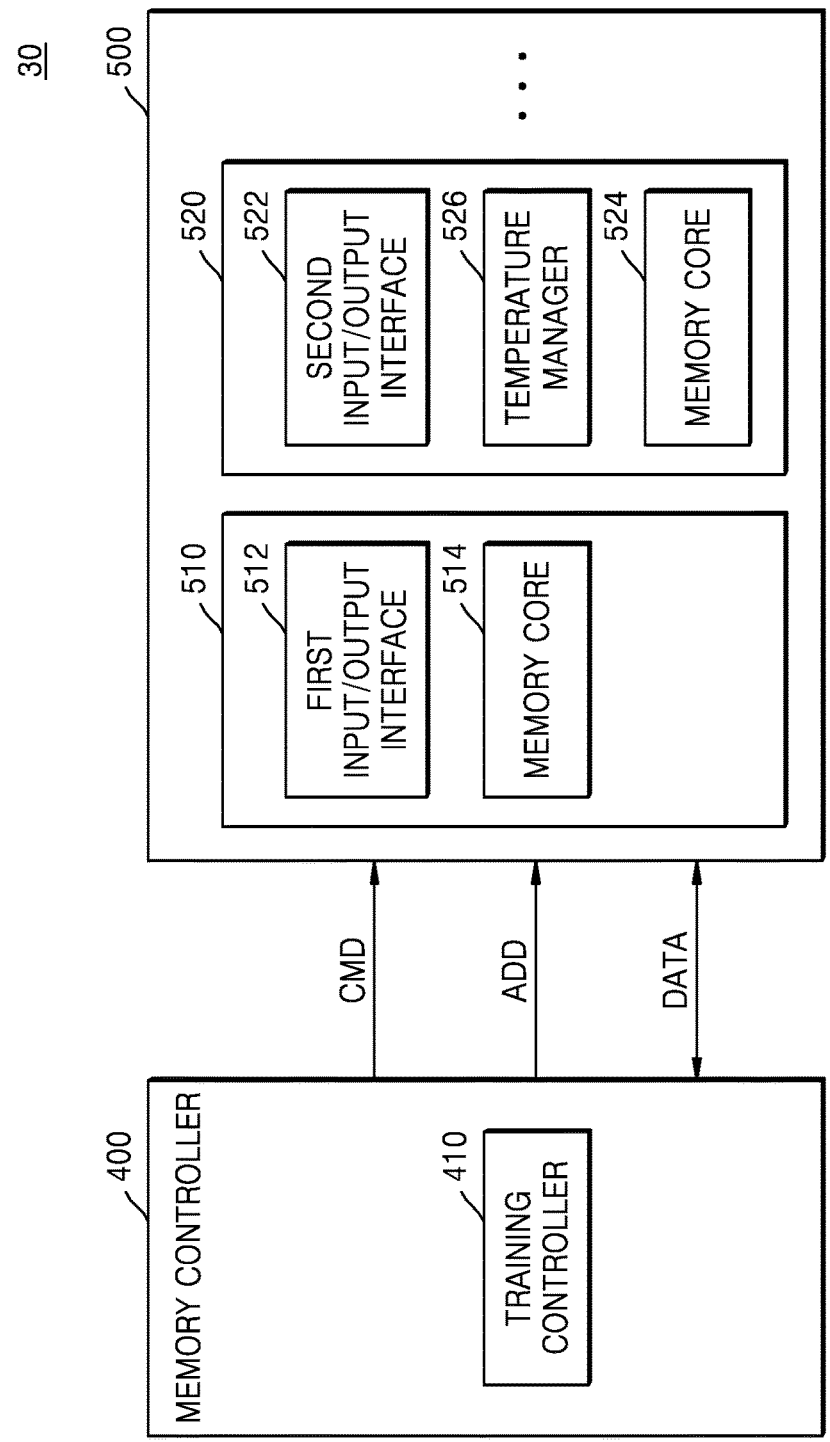
FIG. 9 is a block diagram of a memory system according to an exemplary embodiment of the inventive concept.

FIG. 9 is a block diagram of a memory system according to an exemplary embodiment of the inventive concept. As shown in FIG. 9, a memory system 30 may include a memory controller 400 and a stacked memory device 500. The memory controller 400 may include a training controller 410. The training controller 410 may control a training operation for a first memory chip 510 due to the nature of the stacked memory device 500. Since the training controller 410 corresponds to the training controller 110 of the memory controller 100 of FIG. 1, descriptions mainly related to the stacked memory device 500 will be made hereinafter.

The stacked memory device 500 may include a plurality of memory chips 510, 520, . . . . In an exemplary embodiment, a first memory chip 510 may be a master chip, and memory chips 520, . . . other than the first memory chip 510 may be slave chips. In this embodiment, the first memory chip 510 will be referred to as the master chip, and a second memory chip 520 will be referred to as a slave chip. The master chip 510 may include a first input/output interface 512 for interfacing with the memory controller 400, and a memory core 514. The slave chip 520 may include a second input/output interface 522, a training temperature manager 526, and a memory core 524.

According to an exemplary embodiment, the second input/output interface 522 may be connected to the first input/output interface 512 through a through-electrode, and may receive a command CMD, an address ADD, and data DATA from the memory controller 400 through the through-electrode.

In an exemplary embodiment, the training temperature manager 526 may manage a temperature of the slave chip 520 when the training controller 410 controls the training operation for the master chip 510. In this exemplary embodiment, while the training controller 410 provides a training operation command to the master chip 510 and conducts the training operation for the master chip 510, the training temperature manager 526 may compare the temperature of the slave chip 520 with a reference temperature in response to the training operation command. The training temperature manager 526 may control conduct of a stress-up operation for increasing the temperature of the slave chip 520, based on the comparison. Next, when the conduct of the training operation for the master chip 510 is completed, the training controller 410 may provide a training operation completion command to the stacked memory device 500, and the slave chip 520 may terminate the comparing of the temperature of the slave chip 520 with the reference temperature and the stress-up operation that is based on the comparison, in response to the training operation completion command. In an exemplary embodiment, the slave chips other than the slave chip 520 may also include training temperature managers, and conduct stress-up operations.

In some embodiments, the reference temperature may be set, based on the temperature of the slave chip 520 when the slave chip 520 conducts a normal operation such as read/write operations. For example, the reference temperature may correspond to an average value of a plurality of temperatures of the slave chip 520 sensed when the slave chip 520 conducts the normal operation, or correspond to the highest or lowest temperature among the plurality of sensed temperatures of the slave chip 520. The training temperature manager 526 may include a register, and thereby store the reference temperature.

In an exemplary embodiment, a total temperature of the stacked memory device 500 can be increased by increasing the temperature of the slave chip 520, and optimized parameters upon the normal operation of the master chip 510 can be determined through the conduct of the training operation for the master chip 510. In an exemplary embodiment, the stress-up operation may be conducted only for the slave chip 520, and the training operation for the master chip 510 may be conducted without an interruption, thereby providing an effect of conducting a quick training operation.

Figure 10:
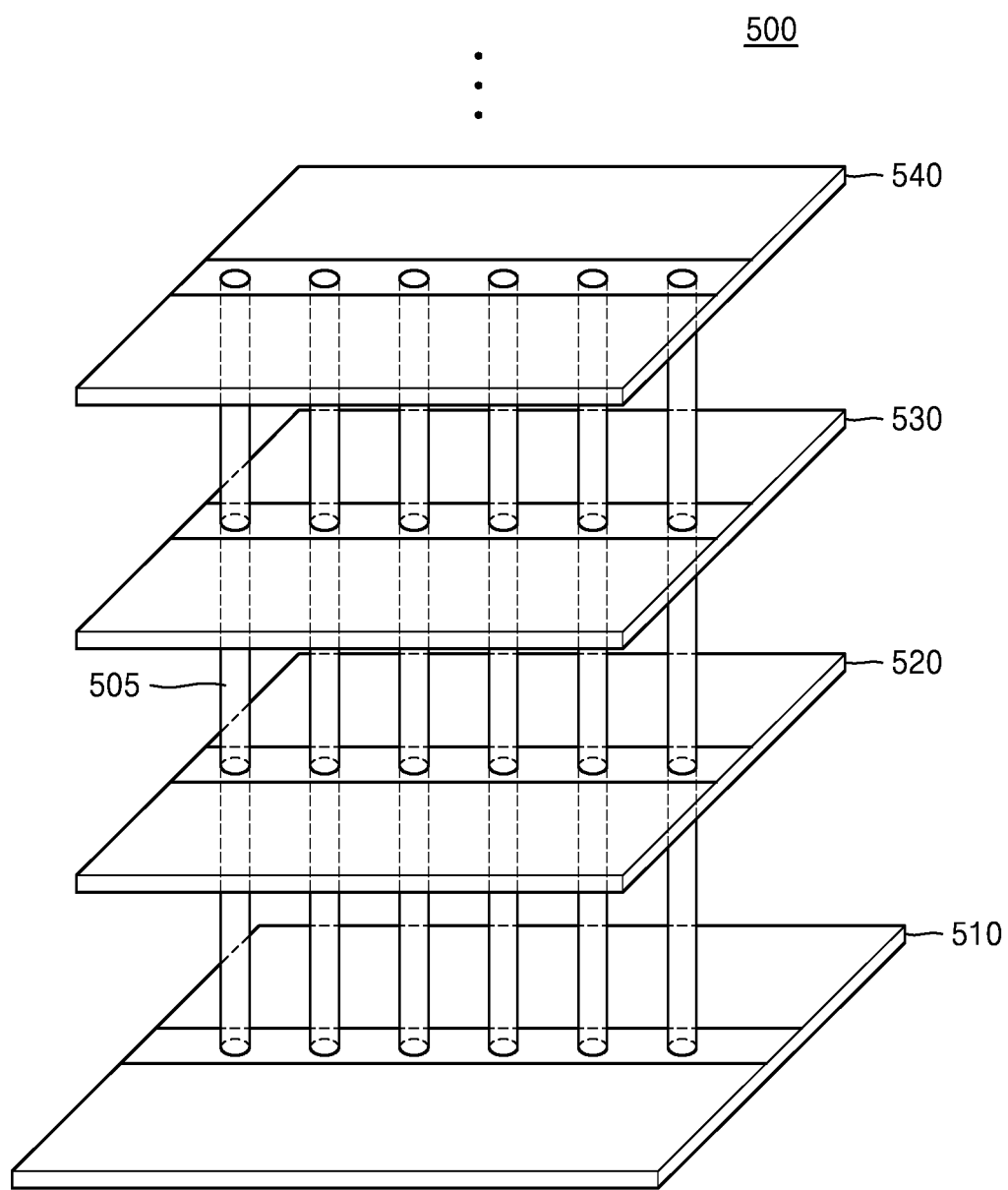
FIG. 10 is a perspective view of an exemplary embodiment of a stacked memory device shown in FIG. 9.

FIG. 10 is a perspective view of an exemplary embodiment of the stacked memory device shown in FIG. 9. As shown in FIG. 10, the stacked memory device 500 may include the master chip 510 and the slave chips 520 to 540, which are electrically connected to each other through the through-electrodes 505. Although the through-electrodes 505 arranged in a line are shown in the exemplary embodiment of FIG. 10, the inventive concept is not limited thereto, and the stacked memory device may have through-electrodes arranged in two lines.

Figure 11:
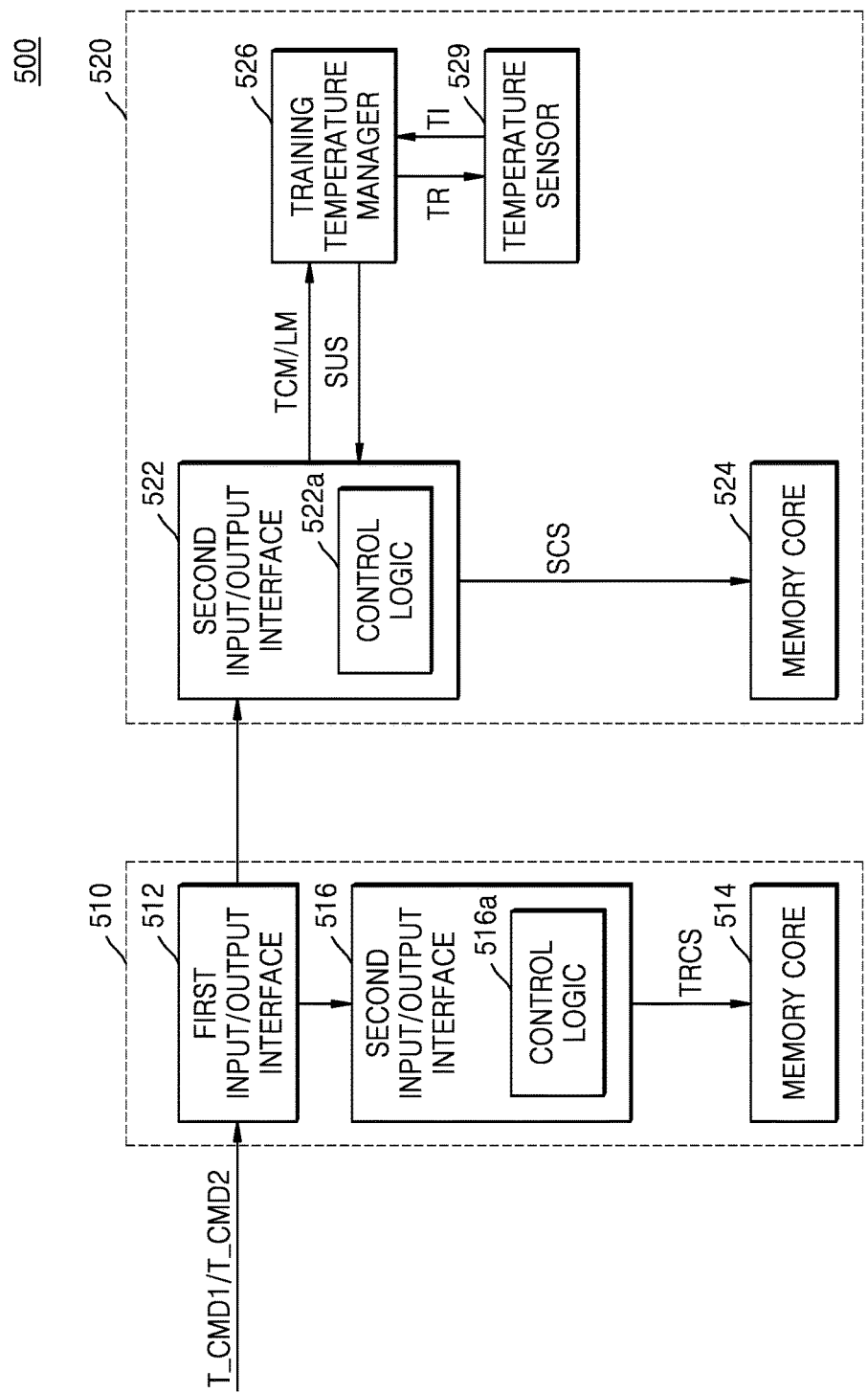
FIG. 11 is a block diagram of an exemplary embodiment of the stacked memory device shown in FIG. 9.

FIG. 11 is a block diagram of an exemplary embodiment of the stacked memory device shown in FIG. 9. As shown in FIG. 11, the master chip 510 may include a first input/output interface 512, a second input/output interface 516, and a memory core 514. The first input/output interface 512 may receive a training operation command T_CMD1 from the memory controller. The first input/output interface 512 may provide the training operation command T_CMD1 to the second input/output interface 516. The second input/output interface 516 may include a control logic 516a. The control logic 516a may include a command decoder and a mode register, and may decode the training operation command T_CMD1 into a training control signal TRCS. The control logic 516a may provide the training control signal TRCS to the memory core 514, and the memory core 514 may conduct a training operation in response to the training control signal TRCS. In this exemplary embodiment, after the training operation is completed, the master chip 510 may receive a training operation completion command T_CMD2 from the memory controller. In an exemplary embodiment, the training operation completion command T_CMD2 may be a refresh command, and when receiving the refresh command T_CMD2 from the memory controller, the master chip 510 may conduct a refresh operation, thereby completing the conduct of the training operation.

In an exemplary embodiment, the slave chip 520 may include a second input/output interface 522, a memory core 524, a training temperature manager 526, and a temperature sensor 529. The second input/output interface 522 may be connected to the first input/output interface 512 through a through-electrode, and thereby receive the training operation command T_CMD1 through the through-electrode. The second input/output interface 522 may include a control logic 522a. The control logic 522a may include a command decoder and a mode register, and may decode the training operation command T_CMD1 into a temperature control mode signal TCM. The second input/output interface 522 may provide the temperature control mode signal TCM to the training temperature manager 526. The training temperature manager 526 may be changed from a normal mode to a temperature control mode in response to the temperature control mode signal TCM. The temperature control mode of the training temperature manager 526 may correspond to an On-state of the training temperature manager 526, and at this time, the training temperature manager 526 may provide a temperature request signal TR requesting a temperature TI of the slave chip 520 to the temperature sensor 529. The temperature sensor 529 may provide the temperature TI of the slave chip 520 to the training temperature manager 526. The training temperature manager 526 may compare the received temperature TI of the slave chip 520 with a reference temperature, and may provide a stress-up signal SUS to the control logic 522a based on the comparison. For example, if the temperature TI of the slave chip 520 is less than the reference temperature, the training temperature manager 526 may generate the stress-up signal SUS for conducting a stress-up operation of the memory core 524, and thereby provide the stress-up signal SUS to the control logic 522a. If the temperature TI of the slave chip 520 is equal to or greater than the reference temperature, the training temperature manager 526 may not generate the stress-up signal SUS.

In an exemplary embodiment, the training temperature manager 526 may compare the temperature TI of the slave chip with the reference temperature by cyclically receiving the temperature TI of the slave chip from the temperature sensor 529 in the temperature control mode of the training temperature manager 526, and may provide the stress-up signal SUS to the control logic 522a based on the comparison. For example, while the training operation for the master chip 510 is conducted, the training temperature manager 526 may cyclically conduct the comparison operation and the providing of the stress-up signal SUS such that the temperature TI of the slave chip 520 is equal to or greater than the reference temperature. The cycle may be pre-set to be stored in the training temperature manager 526, and the training temperature manager 526 may set the cycle based on cycle setting information received from the outside of the memory system.

In an exemplary embodiment, the control logic 522a may provide a stress-up control signal SCS to the memory core 524 in response to the stress-up signal SUS. The memory core 524 may conduct a stress-up operation in response to the stress-up control signal SCS. In an exemplary embodiment, the stress-up control signal SCS may be a refresh operation control signal, and the memory core 524 may conduct a refresh operation in response to the refresh operation control signal SCS, thereby increasing a temperature of the memory core 524.

In an exemplary embodiment, the second input/output interface 522 may be connected to the first input/output interface 512 through the through-electrode, and thereby receive the training operation command T_CMD2 through the through-electrode. The control logic 522a may decode the training operation command T_CMD2 into a normal mode signal LM. The second input/output interface 522 may provide the normal mode signal LM to the training temperature manager 526. The training temperature manager 526 may be changed from the temperature control mode to the normal mode in response to the normal mode signal LM. The training temperature manager 526 may be in an Off-state in the normal mode thereof, and may not conduct the comparison operation and the generating of the stress-up signal SUS. In an exemplary embodiment, the training operation completion command T_CMD2 may be the refresh command, as described above.

However, a configuration disclosed in FIG. 11 is merely an example, and the training temperature manager 526 may provide the stress-up control signal SCS to the memory core 524 based on the comparison of the temperature TI of the slave chip with the reference temperature. In an exemplary embodiment, the training temperature manager 526 may be included in the second input/output interface 522.

Figure 12:
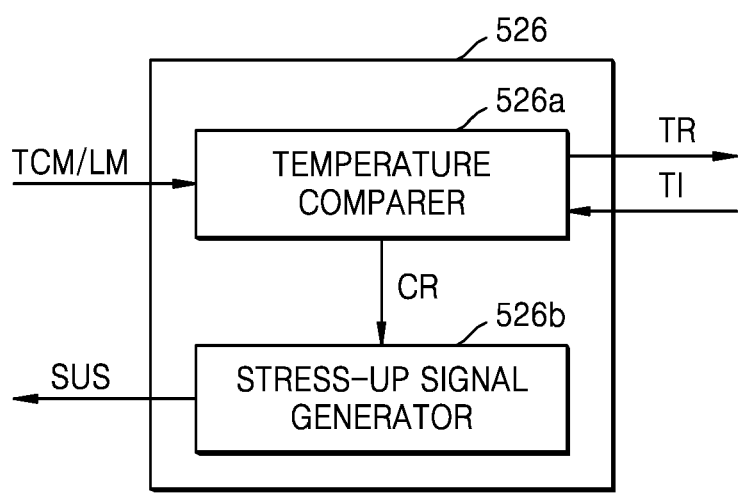
FIG. 12 is a block diagram of an exemplary embodiment of a training temperature manager shown in FIG. 9.

FIG. 12 is a block diagram of an exemplary embodiment of the training temperature manager shown in FIG. 9. As shown in FIG. 12, the training temperature manager 526 may include a temperature comparer 526a and a stress-up signal generator 526b. When receiving the temperature control mode signal TCM, the temperature comparer 526a may be put into an On-state, and thereby cyclically conduct the temperature comparison operation. In this exemplary embodiment, the temperature comparer 526a may provide the temperature request signal TR requesting the temperature TI of the slave chip to the temperature sensor 529 of FIG. 11, and may compare the temperature TI of the slave chip, which is received from the temperature sensor 529, with the reference temperature. The temperature comparer 526a may provide the comparison result signal CR to the stress-up signal generator 526b, and the stress-up signal generator 526b may provide the stress-up signal SUS to the control logic 522a of FIG. 11 by generating the stress-up signal SUS based on the comparison result signal CR. When receiving the normal mode signal LM, the temperature comparer 526a may be put into an Off-state.

Figure 13:
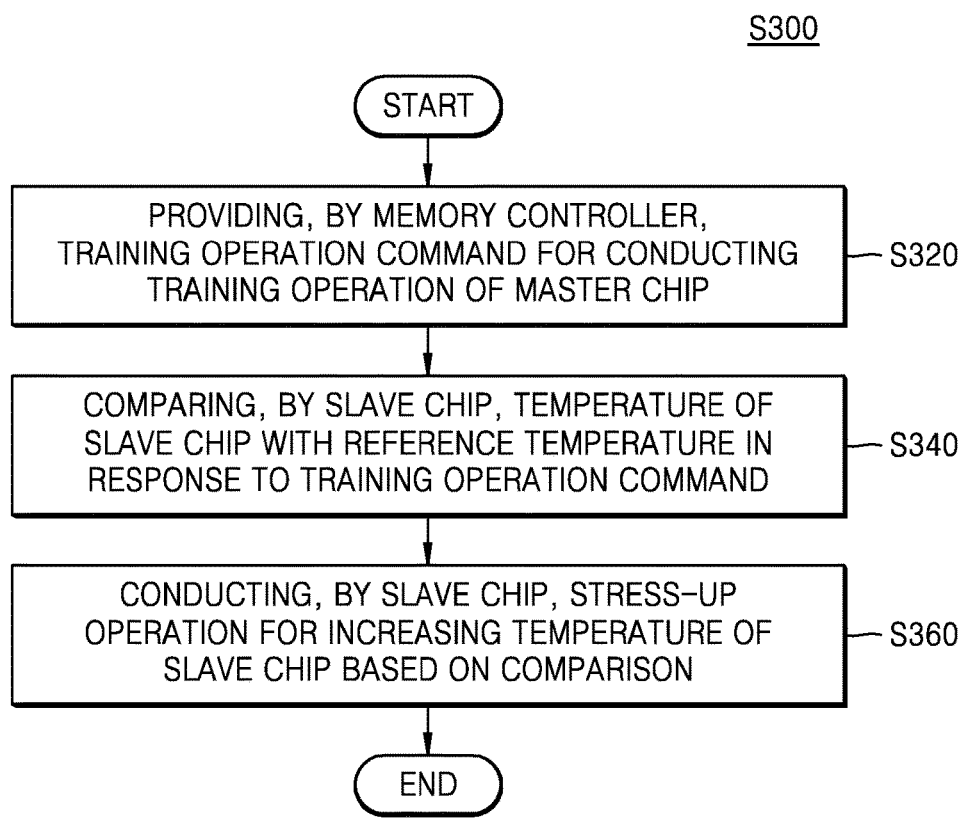
FIG. 13 is a flow chart showing a method of operating a memory system according to an exemplary embodiment of the inventive concept.

FIG. 13 is a flow chart showing a method of operating a memory system according to an exemplary embodiment of the inventive concept.

As shown in FIGS. 9 and 13, the memory controller 400 may provide the training operation command for conducting the training operation for the master chip 510 to the stacked memory device 500 (S320). The training temperature manager 526 of the slave chip 520 may compare the temperature of the slave chip with the reference temperature, in response to the training operation command (S340). The training temperature manager 526 of the slave chip 520 may conduct the stress-up operation for increasing the temperature of the slave chip, based on the comparison (S360). While the stress-up operation of the slave chip is conducted, the master chip 510 may conduct the training operation in response to the training operation command.

Figure 14:
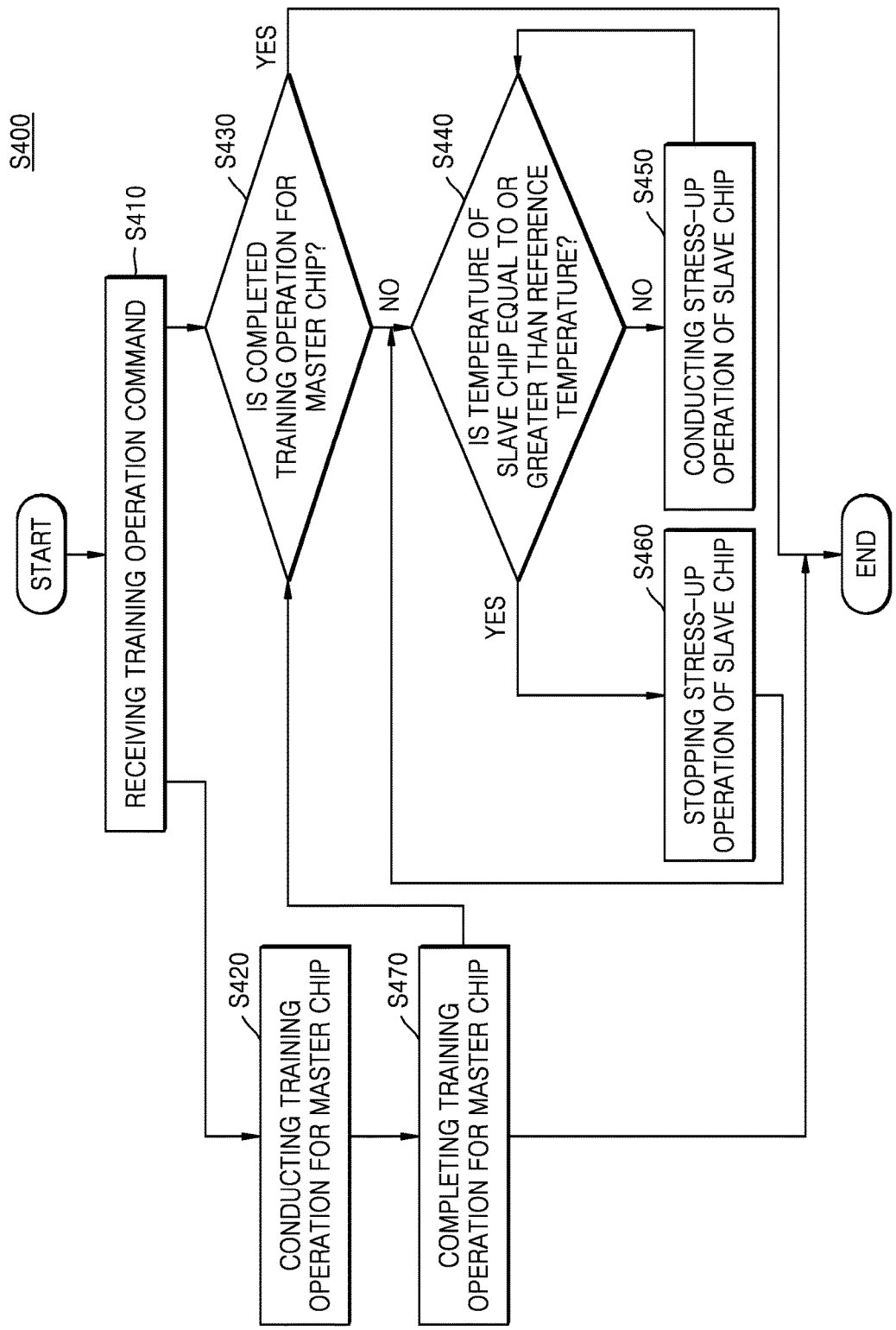
FIG. 14 is a flow chart showing a method of operating a memory system according to another exemplary embodiment of the inventive concept.

FIG. 14 is a flow chart showing a method of operating a memory system according to another exemplary embodiment of the inventive concept.

As shown in FIGS. 9 and 14, the stacked memory device 500 may receive the training operation command for the master chip 510 from the memory controller 400 (S410). The master chip 510 may conduct the training operation in response to the training operation command (S420). When the training operation for the master chip is not completed (S430, No), the training temperature manager 526 of the slave chip 520 may compare the temperature of the slave chip 520 with the reference temperature in response to the training operation command in order to determine whether the temperature of the slave chip 520 is equal to or greater than the reference temperature (S440). The training operation may pause during this time. When the temperature of the slave chip 520 is less than the reference temperature (S440, No), the training temperature manager 526 may conduct the stress-up operation of the slave chip 520 (S450). When the temperature of the slave chip 520 is equal to or greater than the reference temperature (S440, Yes), the training temperature manager 526 may stop the stress-up operation of the slave chip 520 (S460). The training operation may resume at this time. When the training operation for the master chip 510 is completed (S470), the stacked memory device 500 may receive the training operation completion command from the memory controller 400, and the training temperature manager 526 of the slave chip 520 may terminate the comparison operation and the stress-up operation.

Figure 15:
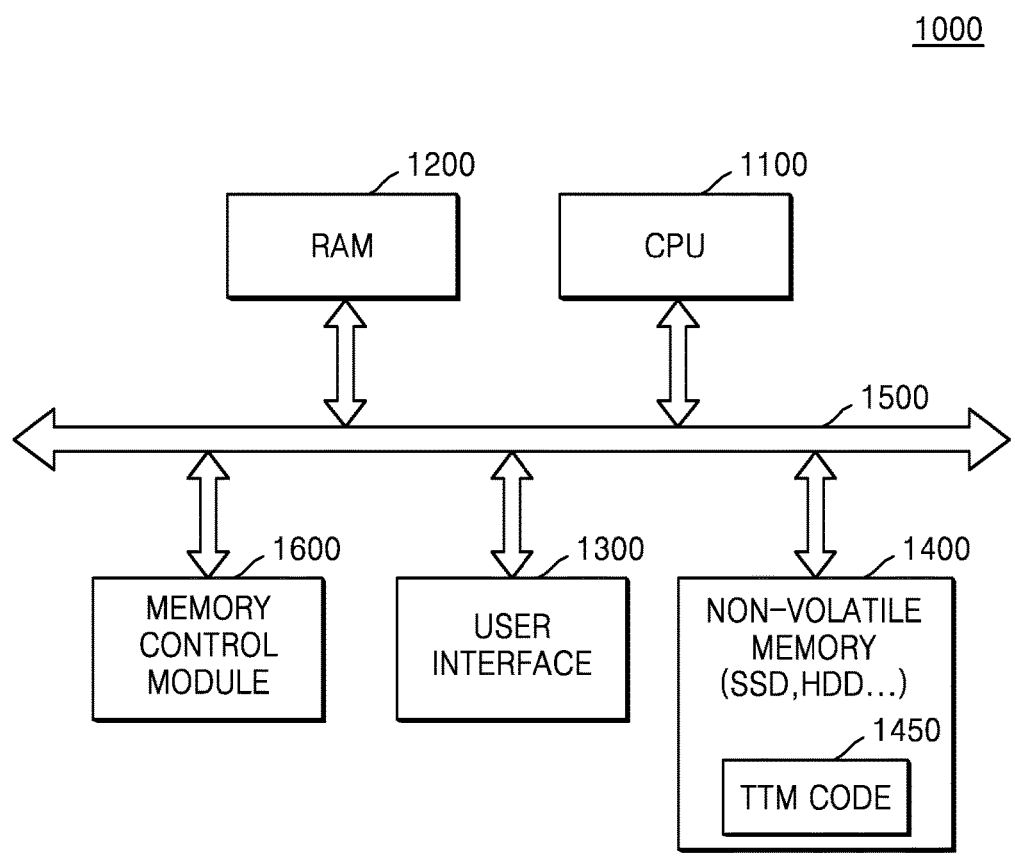
FIG. 15 is a block diagram of a computing system in which a memory system is mounted according to an exemplary embodiment of the inventive concept.

FIG. 15 is a block diagram of a computing system in which a memory system is mounted according to an exemplary embodiment of the inventive concept. The memory device according to the inventive concept may be mounted as a random access memory (RAM) 1200 in a computing system 1000 such as a mobile device or a desk top computer. The memory device mounted as the RAM 1200 may be any one of the memory devices according to the exemplary embodiments described above. In addition, the memory controller according to the inventive concept may be included in a memory control module 1600.

The computing system 1000 according to an exemplary embodiment of the inventive concept includes a central processing unit 1100, the RAM 1200, a user interface 1300, and a non-volatile memory 1400, and wherein each of these components is electrically connected to a bus 1500. The non-volatile memory 1400 may be a mass storage device such as a solid state drive (SSD) or a hard disk drive (HDD). The non-volatile memory 1400 may include a bias code, and the central processing unit 1100 may control the memory control module 1600 with reference to the bias code. The non-volatile memory 1400 may further include a training temperature management code 1450 related to an operation of managing a temperature upon conduct of a training operation.

Since the memory device (or the memory system) according to an exemplary embodiment of the inventive concept is used for the computing system 1000, the central processing unit 1100 may manage the memory control module 1600 with reference to the training temperature management code 1450 such that the memory control module 1600 can control the training operation and the stress-up operation due to the training operation according to the exemplary embodiments described above.

While various aspects of the inventive concept have been particularly shown and described with reference to exemplary embodiments thereof, it will be understood that various changes in form and details may be made therein without departing from the spirit and scope of the following claims.

What is claimed is:

1. A method of operating a memory system comprising a memory controller which controls at least one memory device included in the memory system, the method comprising:
    comparing a temperature of the at least one memory device with a reference temperature;
    conducting a heating operation on the at least one memory device in order to increase a temperature of the at least one memory device, based on a result of the comparing step;
    controlling the heating operation on the at least one memory device until it is determined that the temperature of the at least one memory device becomes equal to or greater than the reference temperature; and
    conducting a first training operation for the at least one memory device after it is determined that the temperature of the at least one memory device is equal to or greater than the reference temperature, wherein the memory device includes a master chip and a slave chip electrically connected to the master chip, and the method further comprising:

receiving a training operation command from the memory controller;

comparing, by the slave chip, a temperature of the slave chip with a reference temperature in response to the training operation command;

conducting, by the slave chip, a heating operation for increasing the temperature of the slave chip based on the result of the comparing step;

controlling the heating operation on the slave chip until the temperature of the slave chip becomes equal to or greater than the reference temperature; and conducting a training operation for the master chip when the temperature of the slave chip is equal to or greater than the reference temperature.

2. The method according to claim 1, further comprising:
after the first training operation has begun, stopping the first training operation when the temperature of the at least one memory device is less than the reference temperature.

3. The method according to claim 2, further comprising:
resuming the first training operation when the temperature of the at least one memory device is equal to or greater than the reference temperature.

4. The method according to claim 1, further comprising:
comparing the temperature of the at least one memory device with the reference temperature after the first training operation is completed and before conducting a second training operation for the at least one memory device;

conducting the heating operation on the at least one memory device in order to increase the temperature of the at least one memory device, based on the comparison, before conducting the second training operation; and conducting the second training operation, wherein the second training operation is conducted when the temperature of the at least one memory device is equal to or greater than the reference temperature.

5. The method according to claim 1, further comprising:
setting, by the memory controller, the reference temperature based on an external temperature received from the outside of the memory system.

6. The method according to claim 1, wherein the heating operation for increasing the temperature of the at least one memory device based on the comparison comprises:

providing a command to the at least one memory device when the temperature of the at least one memory device is less than the reference temperature; and conducting, by the at least one memory device, the heating operation for increasing the temperature of the at least one memory device in response to the command.

7. The method according to claim 6, wherein the heating operation for increasing the temperature of the at least one memory device is a stress-up operation which is an operation or various operations for increasing a temperature of a memory core included in the at least one memory device based on the result of comparing the temperature of the at least one memory device with the reference temperature.

8. The method according to claim 7, wherein the stress-up operation is a refresh operation for a memory cell array comprised in the at least one memory device.

9. The method according to claim 7, wherein the stress-up operation is an operation of writing a predetermined pattern data stored in a mode register to the memory core.

10. The method according to claim 1, further comprising:
providing, by the memory controller, a temperature request command requesting the temperature of the at least one memory device to the at least one memory device; and providing, by the at least one memory device, the temperature of the at least one memory device to the memory controller in response to the temperature request command.

11. The method according to claim 1, wherein the memory system comprises a memory module including a plurality of memory devices, and the method further comprises conducting the heating operation for increasing a temperature for each of the plurality of memory devices simultaneously.

12. The method according to claim 11, wherein the comparing of the temperature of the memory device with the reference temperature comprises:

receiving a temperature of each of the plurality of memory devices from the plurality of memory devices, and comparing the lowest temperature among the temperatures of the plurality of memory devices or an average temperature of the plurality of memory devices with the reference temperature.

13. The method according to claim 1, wherein the memory device is a stacked memory device, and the method further comprises:

providing, by the memory controller, a training operation completion command to the stacked memory device; and terminating, by the slave chip, the comparing of the temperature of the slave chip with the reference temperature, and the heating operation for increasing the temperature of the slave chip, in response to the training operation completion command.

14. A method of operating a memory, comprising:
receiving a temperature of a memory device;
receiving a first command to compare the temperature of the memory device to a reference temperature;
comparing the temperature of the memory device to the reference temperature based on the first command;
when it is determined that the temperature of the memory device is lower than the reference temperature, receiving a second command to increase the temperature of the memory device; and
when it is determined that the temperature of the memory device is equal to or more than the reference temperature, transmitting a third command to perform a training operation for the memory device,
wherein the memory device includes a master chip and a slave chip electrically connected to the master chip, and the method further comprising:
receiving a training operation command from a memory controller;
comparing, by the slave chip, a temperature of the slave chip with a reference temperature in response to the training operation command; and
conducting, by the slave chip, a heating operation for increasing the temperature of the slave chip based on the result of the comparing step,
wherein while the memory controller conducts a training operation for the master chip, the slave chip conducts a stress-up operation, wherein the stress-up operation is an operation or various operations for increasing a temperature of a memory core included in the slave chip, based on the result of comparing the temperature of the slave chip with the reference temperature.

15. The method of claim 14, further comprising:

decoding the second command into a refresh control signal for controlling a refresh operation of the memory device;

generating a refresh address for selecting a row, which is to be subjected to a refresh, from a memory cell array included in a memory core of the memory device; and prior to determining that the temperature of the memory device is equal to or more than the reference temperature, conducting a refresh operation on the selected row based on the refresh control signal.

16. The method according to claim 15, wherein the refresh operation includes applying a refresh voltage to the memory cell array of the memory core to increase a temperature of the memory core.

17. A memory system comprising:

at least one memory device; and a memory controller configured to control the at least one memory device, wherein the memory controller is configured to:

compare a temperature of the at least one memory device with a reference temperature;

conduct an operation on the at least one memory device in order to increase a temperature of the at least one memory device;

control the operation on the at least one memory device until the temperature of the at least one memory device becomes equal to or greater than the reference temperature; and conduct a first training operation for the at least one memory device when the temperature of the at least one memory device is equal to or greater than the reference temperature, wherein the at least one memory device includes a master chip and a slave chip electrically connected to the master chip and the memory controller is configured to:

control the operation on the slave chip until the temperature of the slave chip becomes equal to or greater than the reference temperature; and conduct the first training operation for the master chip when the temperature of the slave chip is equal to or greater than the reference temperature, and wherein while the memory controller conducts a training operation for the master chip, the slave chip conducts a stress-up operation, wherein the stress-up operation is an operation or various operations for increasing a temperature of a memory core included in the slave chip, based on the result of comparing the temperature of the slave chip with the reference temperature.

* * * * *